(12) United States Patent
Janssens et al.

(10) Patent No.: US 8,189,173 B2
(45) Date of Patent: May 29, 2012

(54) POLARIZATION CONTROL APPARATUS AND METHOD

(75) Inventors: Marcel Henk André Janssens, Delft (NL); Oscar Franciscus Jozephus Noordman, Eindoven (NL); Huibert Visser, Zevenhuizen (NL); Evert Nieuwkoop, Pijnacker (NL)

(73) Assignee: ASML Netherlands B.V., Veldhoven (NL)

( * ) Notice: Subject to any disclaimer, the term of this patent is extended or adjusted under 35 U.S.C. 154(b) by 644 days.

(21) Appl. No.: 12/352,326

(22) Filed: Jan. 12, 2009

(65) Prior Publication Data

US 2009/0201483 A1 Aug. 13, 2009

Related U.S. Application Data

(60) Provisional application No. 61/022,932, filed on Jan. 23, 2008.

(51) Int. Cl.
*G03B 27/72* (2006.01)
(52) U.S. Cl. ........................................ 355/71; 359/298
(58) Field of Classification Search .................. 355/67, 355/71, 68; 359/204.3, 298, 301, 307, 315, 359/318, 483.01, 484.01, 489.01, 489.07
See application file for complete search history.

(56) References Cited

U.S. PATENT DOCUMENTS

| | | | | |
|---|---|---|---|---|
| 2,976,764 A | * | 3/1961 | Hyde et al. | 356/367 |
| 3,532,891 A | * | 10/1970 | Simmons et al. | 359/255 |
| 3,780,296 A | * | 12/1973 | Waksberg et al. | 250/201.1 |
| 3,971,930 A | * | 7/1976 | Fitzmaurice et al. | 398/213 |
| 3,988,704 A | * | 10/1976 | Rice et al. | 359/250 |
| 4,071,751 A | * | 1/1978 | Waksberg | 250/201.1 |
| 2004/0234276 A1 | * | 11/2004 | Hayashi et al. | 398/152 |
| 2005/0146704 A1 | * | 7/2005 | Gruner et al. | 355/71 |
| 2006/0119825 A1 | * | 6/2006 | Munnig Schmidt | 355/67 |
| 2007/0070501 A1 | * | 3/2007 | Wen et al. | 359/501 |

FOREIGN PATENT DOCUMENTS

| | | |
|---|---|---|
| JP | 03-208006 A | 9/1991 |
| JP | 2005-005521 A | 1/2005 |
| JP | 2007-180088 A | 7/2007 |

OTHER PUBLICATIONS

Translation for JP 2007-180088 published Jul. 12, 2007.*
English-Language Abstract for JP 2005-005521 A, published Jan. 6, 2005; 1 page.
English-Language Abstract for JP 2007-180088 A, published Jul. 12, 2007; 1 page.

(Continued)

*Primary Examiner* — Glen Kao
(74) *Attorney, Agent, or Firm* — Sterne, Kessler, Goldstein & Fox P.L.L.C.

(57) ABSTRACT

Apparatus and methods are used to control a polarization state of a radiation beam. A polarization control unit is configured to modulate a polarization state of at least a part of a radiation beam. A determination arrangement is configured to subsequently determine the polarization state of the at least a part of the radiation beam. A feedback unit is configured to provide signals to the polarization control arrangement based on at least the determined polarization state in order to correct for deviation in the polarization state of the part of the radiation beam from a desired polarization state. For example, the correction may ensure that the polarization state of the part of the radiation beam is at, or returns to, the desired polarization state.

34 Claims, 10 Drawing Sheets

OTHER PUBLICATIONS

English-Language Translation of Notification of Reason(s) for Refusal directed to related Japanese Patent Application Japanese Patent Application No. 2009-007725, mailed Jul. 5, 2011, from the Japanese Patent Office; 3 pages.

English-Language Translation of Notification of Reason(s) for Refusal directed to related Japanese Patent Application No. 2009-007725, mailed Mar. 6, 2012, from the Japanese Patent Office; 3 pages.

* cited by examiner

POLARIZATION CONTROL APPARATUS AND METHOD

CROSS REFERENCE TO RELATED APPLICATIONS

This application claims benefit under 35 U.S.C. §119(e) to U.S. Provisional Patent Application No. 61/022,932, filed Jan. 23, 2008, which is incorporated by reference herein in its entirety.

BACKGROUND

1. Field of the Invention

The present invention relates to an apparatus and method for controlling a polarization state of a radiation beam.

2. Background Art

A lithographic apparatus is a machine that applies a desired pattern onto a substrate or part of a substrate. A lithographic apparatus may be used, for example, in the manufacture of flat panel displays, integrated circuits (ICs) and other devices involving fine structures. In a conventional apparatus, a patterning device, which may be referred to as a mask or a reticle, may be used to generate a circuit pattern corresponding to an individual layer of a flat panel display (or other device). This pattern may be transferred on (part of) the substrate (e.g., a glass plate), e.g., via imaging onto a layer of radiation-sensitive material (resist) provided on the substrate.

Instead of a circuit pattern, the patterning means may be used to generate other patterns, such as a color filter pattern or a matrix of dots. Instead of a mask, the patterning device may comprise a patterning array that comprises an array of individually controllable elements. An advantage of such a system compared to a mask-based system is that the pattern can be changed more quickly and for less cost.

A radiation beam that applies a pattern to a substrate (e.g., a resist coated substrate) may be a continuous beam, or may be a beam comprising a plurality of pulses. For instance, in one example the radiation beam may comprise radiation beam pulses. The radiation beam pulses may be provided directly by the radiation beam source, or by selective allowing or prevention of the passage of a continuous radiation beam.

When using a pulsed radiation beam to apply a pattern to a substrate, a plurality of pulses may need to be incident on the same area of the substrate in order to apply the pattern, or a part of the pattern, to the area of the substrate. The energy of each pulse may vary by ±10% of a mean value for each pulse. However, the variation in pulse energy can be taken into account using a fast control algorithm and control electronics. The variation in pulse energy is also often averaged out by the fact that a plurality of pulses is used to pattern a given area of a substrate. For instance, to achieve a required radiation dose on a particular area of the substrate, between forty and sixty radiation beam pulses may be required. The resultant fluctuation in the cumulative dose may only vary by +0.1% a mean value. Thus, in some applications, the variation in energy of pulses of a pulsed radiation beam may not have much of an effect on the application of a pattern or patterns to a substrate.

In some applications, including maskless lithography apparatus and methods that use a mirror array or the like, it may be desirable to use only a single pulse of a pulsed radiation beam to provide an area of the substrate with a required dose of radiation. Since only a single pulse will be used to provide the required dose, the above mentioned variation in energy for each dose may result in a similar (e.g., ±10% of the mean) variation in the radiation dose applied to the area of the substrate. Such a large variation in the dose of radiation may result in an unacceptable variation in the line width of patterns applied to the substrate. In order to achieve acceptable control of the line width of patterns applied to the substrate, variation in the energy of the radiation beam pulses is preferably less than 10% of a mean value, for example, at most 0.5% of a mean value. However, current radiation beam sources are not capable of supplying a pulsed radiation beam with such a low variation in pulse energy.

A possible solution to the variation in the energy of pulses of a radiation beam is to trim (or control) the energy of an individual pulse using a fast detector and a fast optical shutter, for example detectors and shutters having nano-second response times. For instance, a suitable shutter may be a Pockels cell. As will be known in the art, Pockels cells are a common electro-optic device used for light modulation. A Pockels cell may be used to change the polarization state of a radiation beam which passes through the Pockels cell. By combining the Pockels cell with an optical analyzer, an optical switch may be created. For example, by rotating the polarization state of a radiation beam by 90° degrees, the radiation beam may be selectively allowed or prevented from passing through the optical analyzer and onto or through other elements of the lithographic apparatus.

One problem associated with the use of a Pockels cell, or other electro-optic devices, is its susceptibility to changes in the environment. For instance, a small change in temperature of the Pockels cell may have a significant effect on the control or changing of the polarization state of the radiation beam which passes through the cell. If the polarization state of the radiation beam were not controlled accurately enough, too much or not enough radiation may pass through the optical analyzer and on to or through other elements of the lithographic apparatus. For example, in one situation, it may be desired to pass as much light as possible through the optical analyzer and on to or through other elements of lithographic apparatus. In this situation, a change in the polarization state of the radiation beam caused by a change in temperature of the Pockels cell may reduce the intensity of the radiation beam which passes on to or through other elements of lithographic apparatus. In another example, it may desired to prevent any part of the radiation beam from passing on to or through other elements of the lithographic apparatus In this situation, a change in the polarization state of the radiation beam caused by change in temperature of the Pockels cell may result in a portion of the radiation beam passing through the optical analyzer and on to or through other elements of the lithographic apparatus. It is desirable to reduce or eliminate the drift (or deviation) in the polarization state of the radiation beam due to, for example, changes in the temperature of the device which controls the polarization state.

SUMMARY

Therefore, what is needed is an apparatus and method that for controlling the variation in the energy of pulses of a radiation beam.

In one embodiment, there is provided an apparatus for controlling a polarization state of a radiation beam comprising a polarization control unit, a determination unit, and a feedback unit. The polarization control unit is configured to modulate a polarization state of at least a part of a radiation beam. The determination unit is configured to determine the polarization state of the part of the radiation beam, and the feedback unit is configured to supply control signals to the polarization control unit based on the determined polarization state. Further, the feedback unit is configured to correct for deviation in the polarization state of the part of the radiation beam from a desired polarization state.

In another embodiment, there is provided a lithographic apparatus comprising an illumination system, an array of individually controllable elements, a projection system, and a polarization state control apparatus. The illumination system is configured to condition a beam of radiation. The array of individually controllable elements being is to modulate the beam of radiation. The projection system is configured to project the modulated beam of radiation onto a substrate. The polarization state control apparatus comprises a polarization control unit is configured to modulate a polarization state of at least a part of a radiation beam, a determination unit configured to determine the polarization state of the part of the radiation beam, and a feedback unit configured to supply control signals to the polarization control unit based on the determined polarization state. The feedback unit is configured to correct for deviation in the polarization state of the part of the radiation beam from a desired polarization state.

In a further embodiment, there is provided a method for controlling a polarization state of a radiation beam comprising the following steps: modulating a polarization state of at least a part of a radiation beam; determining the polarization state of the part of the radiation beam; and controlling the modulation of the polarization state of the part of a radiation beam based on the determined polarization state to correct for deviation in the polarization state of the part of the radiation beam from a desired polarization state. In an additional embodiment, one or both of the determining and controlling may be repeated continuously or periodically.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
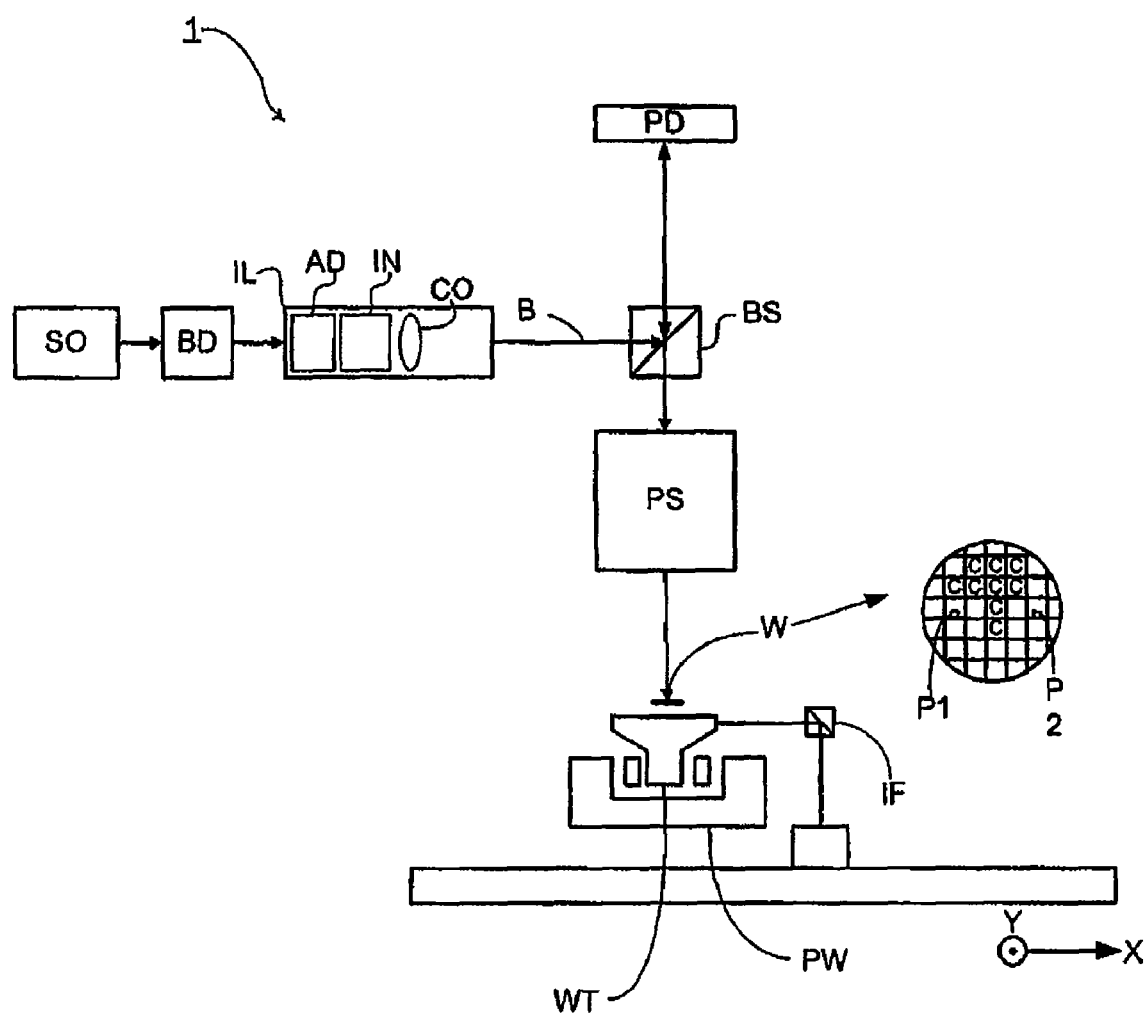
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
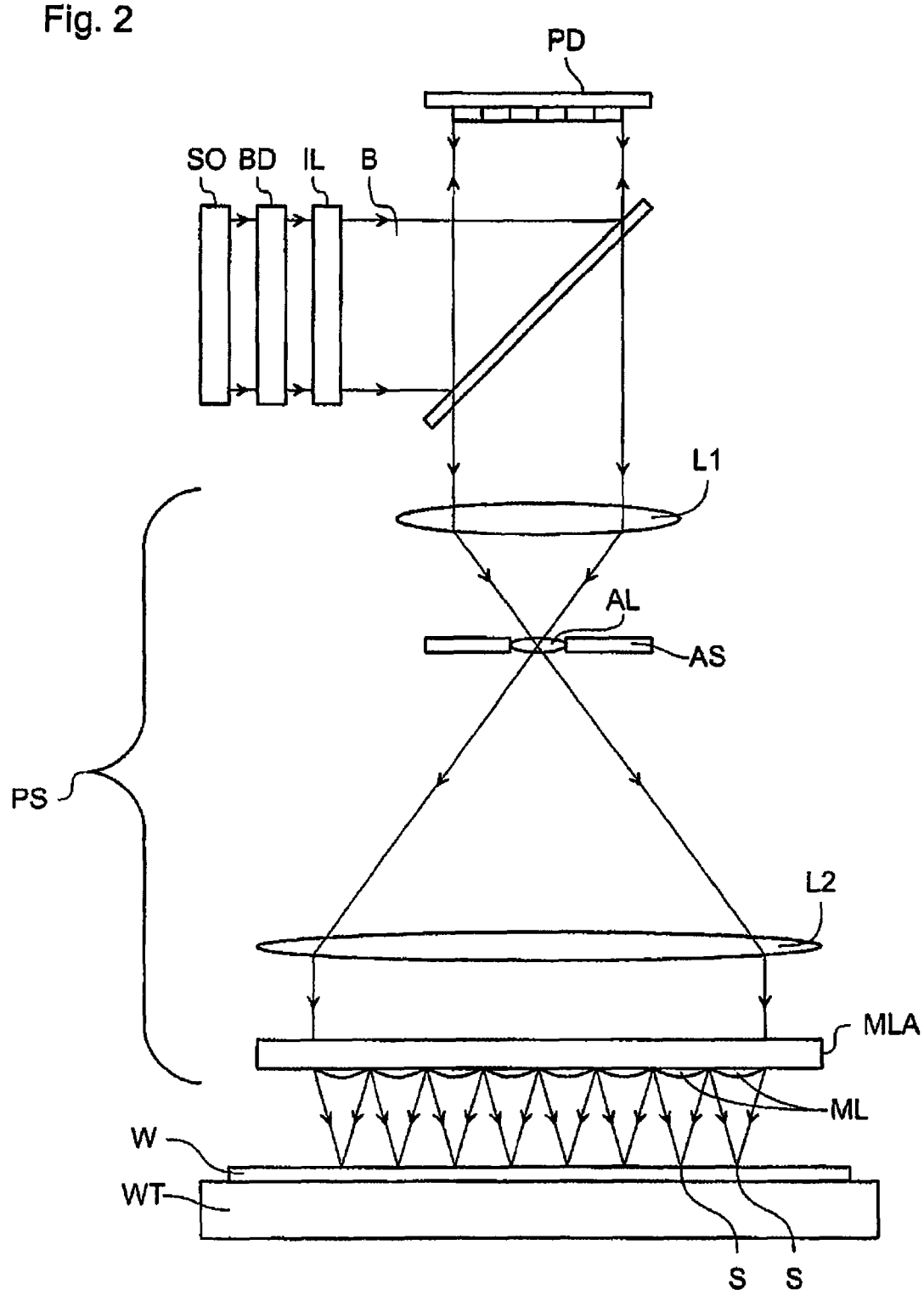

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
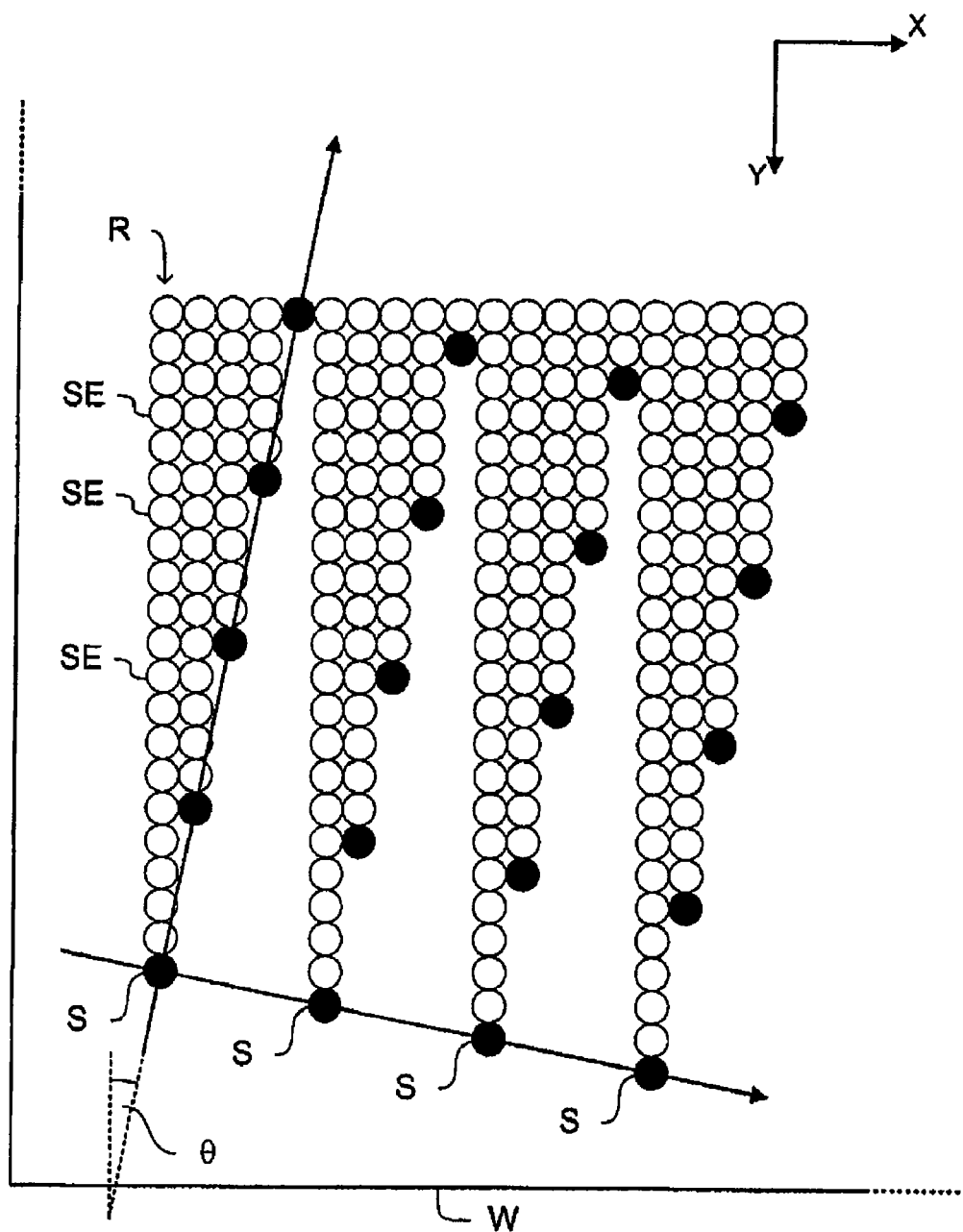
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ can be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Figure 4:
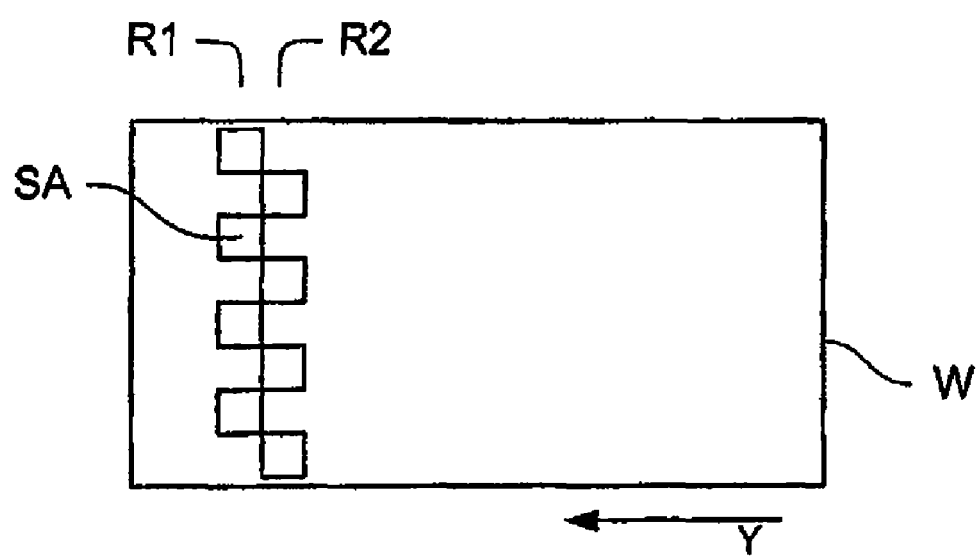
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5A:
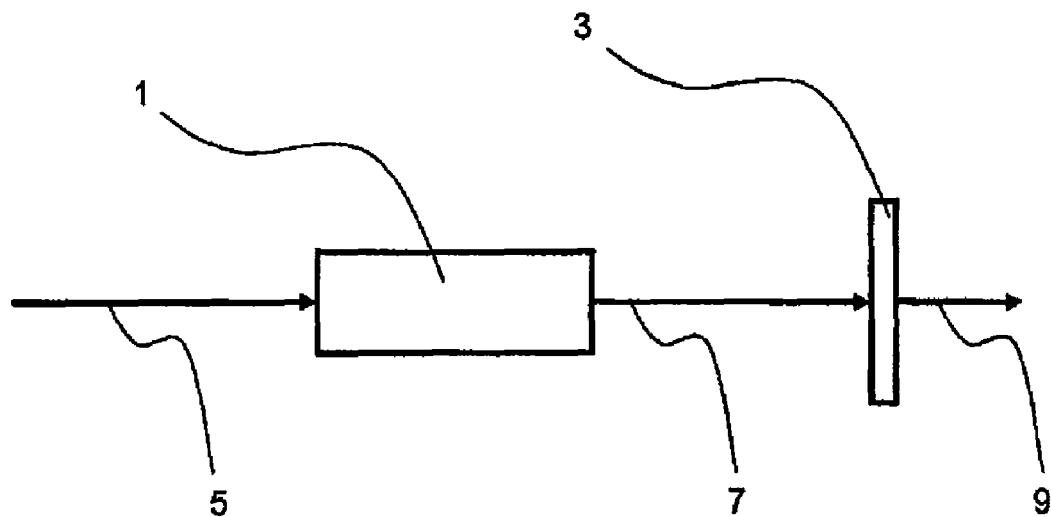
FIGS. 5a and 5b depict, respectively, optical switches, according to embodiments of the present invention.

As discussed above, it is sometimes desirable to use a pulsed radiation beam to apply a pattern to a substrate. In order to reduce or eliminate variations in intensity between pulses of the pulsed radiation beam, an optical switch may be used to control (e.g., trim) a length of the radiation beam pulse in order to control an energy of the radiation beam pulse. FIG. 5a illustrates an optical switch, according to an embodiment of the present invention. In the embodiment of FIG. 5a, the switch comprises a Pockels cell 1 and an optical analyzer 3. Pockels cell 1 may be formed from crystalline quartz. Crystalline quartz exhibits the property of birefringence, and Pockels cell 1 may also resistant to UV radiation that is commonly used in lithography. The property of bi-refringence causes a radiation beam incident upon the Pockels cell to be split into two orthogonal components that move at different speeds through the Pockels cell 1. When the two components of the radiation beam exit the Pockels cell 1 and combine with one another, the phase difference between the components may be such that the polarization state of the exiting radiation beam is different from the polarization state of the radiation beam entering the Pockels cell 1.

For example, FIG. 5a depicts a linearly polarized radiation beam 5 that falls incident upon the Pockels cell 1. The Pockels cell 1 is controlled such that there is no rotation in the polarization state of the incident linearly polarized radiation beam 5 as it travels through the Pockels cell 1. Thus, the radiation beam 7 is also linearly polarized leaving the Pockels cell 1, and the linearly polarized radiation beam exhibits the same polarization orientation as the incident linearly polarized radiation beam 5.

Optical analyzer 3 is configured to allow or to prevent transmission of an incident radiation beam depending on the polarization state and orientation of the radiation beam. In an embodiment, the optical analyzer 3 may be configured to only allow transmission of a radiation beam that has been linearly polarized with a certain orientation. In such an instance, optical analyzer 3 allows transmission of the radiation beam 7 which left the Pockels cell 1, as shown in FIG. 5a. The transmitted radiation beam 9 is linearly polarized and has the same orientation as the radiation beam 5 that was incident upon the Pockels cell 1 (and also the radiation beam 7, which left the Pockels cell 1).

Figure 5B:
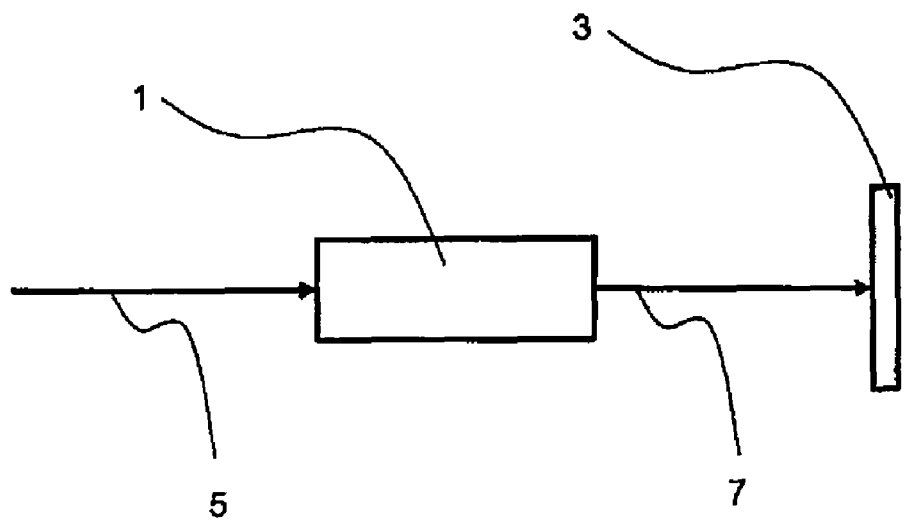

FIG. 5b illustrates an additional embodiment of the optical switch depicted in FIG. 5a. In the embodiment of FIG. 5b, the Pockels cell 1 has been controlled to rotate the polarization state of the incident radiation beam 5 by 90°. Thus, the radiation beam 7 leaving the Pockels cell 1 has a linear polarization state that is orthogonal to the polarization state of the incident radiation beam 5. Because the polarization state of the radiation beam has been rotated by 90°, the radiation beam is unable to pass through the optical analyzer 3. As described above, the optical switch may be configured to selectively allow or prevent the passage of a radiation beam onto or through, for example, other elements of the lithographic apparatus (e.g., those elements described with reference to FIG. 1). Appropriate timing of the allowing or prevention of the passage of the radiation beam can be used to control, for example, the energy of one or more radiation beam pulses which form the radiation beam.

The optical switches described above in FIGS. 5a and 5b may be incorporated into the lithographic apparatus shown in and described with reference to FIG. 1. In one embodiment, the optical switch may form part of the source SO, beam delivery system BD, or illuminator IL. Alternatively, the optical switch may be located outside of these elements. In additional embodiments, the optical switch may be located at any position in the path of the radiation beam that applies a pattern to a substrate without departing from the sprit or scope of the present invention.

As described with regards to FIGS. 5a and 5b, the Pockels cell may be used to change the polarization state of a radiation beam transmitted through the Pockels cell. Amongst other things, the change in the polarization state depends on the length of the Pockels cell, i.e., the amount of material through which the radiation beam must pass before it leaves the Pockels cell. For example, the polarization state of a radiation beam passing through the Pockels cell may change from linear to elliptical to circular to elliptical and then again to a linear polarization state. These changes may result in a change in orientation of the linearly polarized beam from a first angle to an angle orthogonal to this first angle (i.e., a rotation of the linearly polarized state by 90°). In various embodiments of the present invention, the polarization state of the radiation beam may be controlled using a number of techniques that depend on how far the radiation beam travels through the Pockels cell, and correspondingly, that are independent of the length of the Pockels cell 1.

The Pockels cell will expand and contract with corresponding changes in its temperature. Such expansion or contraction will have a corresponding effect on the length of the Pockels cell, and therefore the distance the radiation beam travels as it is transmitted through the Pockels cell. Since the distance traveled by the radiation beam as it passes through the Pockels cell will change, so will the resultant polarization state of the radiation beam as it leaves the Pockels cell. As such, a drift or deviation in temperature of the Pockels cell can result in a deviation in the polarization state of the radiation beam which emerges from the Pockels cell. The deviation will usually be associated with, or relative to, a desired polarization state. In one embodiment, the deviation may be a slight elliptical polarization from an initial (and desired) linear polarization state.

Deviation of the polarization state of the radiation beam emerging from the Pockels cell will have a consequential effect on the overall effectiveness of the optical switch. In one embodiment, the optical analyzer 3 of FIGS. 5a and 5b may be configured to allow the passage of a radiation beam that is linearly polarized in a first orientation, for example 0°. If the radiation beam that emerges from the Pockels cell 1 is not linearly polarized with an orientation of 0°, some of the radiation beam will be unable to pass through the optical analyzer 3, thus reducing the intensity of the radiation beam which emerges from the optical switch. In one embodiment, it is desirable to reduce or eliminate any losses in intensity in the lithographic apparatus in order to ensure that the maximum amount of radiation (i.e., the maximum possible dose) is available. Similarly, if the optical switch is arranged to, in theory, prevent the passage or radiation beam by having the Pockels cell 1 rotate the orientation of a linearly polarized radiation beam from 0° to 90°, any deviation in temperature will again result in a deviation in the polarization state from a desired state. Therefore, instead of the optical analyzer 3 preventing passage of the radiation beam in its entirety, a portion of the radiation beam will still pass through the optical analyzer 3 and through or onto other elements of the lithographic apparatus. Such an effect is undesirable if the function of the optical switch is to, at least in one configuration, prevent the passage of the radiation beam in its entirety.

Figure 6:
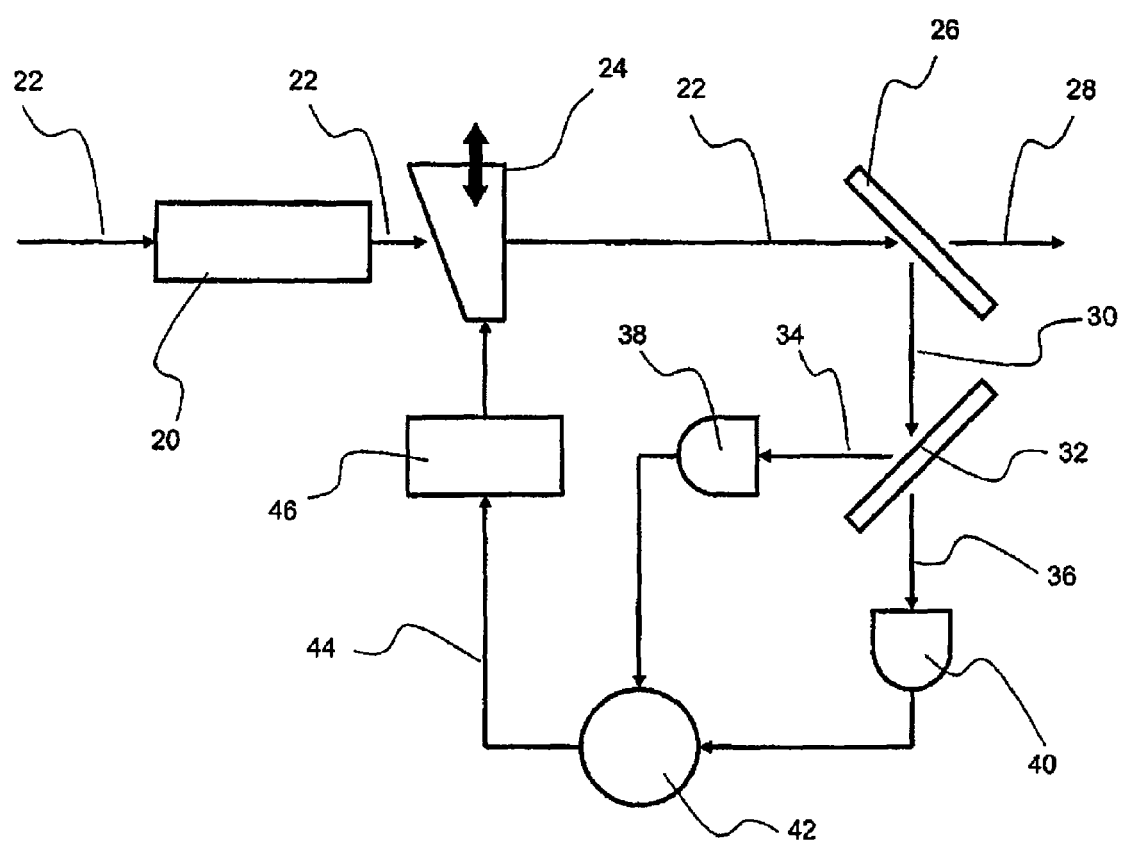
FIGS. 6 and 7 depict, respectively, polarization state control apparatus, according to embodiments of the present invention.

FIG. 6 schematically depicts a polarization control apparatus in accordance with an embodiment of the present invention. The apparatus of FIG. 6 comprises a Pockels cell 20 through which a radiation beam pulse 22 is transmitted. After leaving the Pockels cell 20, the radiation beam pulse 22 passes through a wedge 24 that is formed from the same material as the Pockels cell (for example, crystalline quartz). The wedge 24 is moveable in a direction perpendicular to the direction of propagation of the radiation beam pulse 22 such that the radiation beam pulse 22 can be made to pass through a greater or lesser portion of the wedge 24. Once the radiation beam pulse 22 has been transmitted through the wedge 24, the radiation beam pulse 22 falls incident upon a beam splitter 26. The beam splitter 26 splits the radiation beam pulse 22 into two parts: a main radiation beam pulse 28 and a sample radiation beam pulse 30.

The main part of the radiation beam pulse 28 may be arranged to pass onto or through other parts of the lithographic apparatus. In one embodiment, at least a part of the main part of the radiation beam pulse 28 may pass on to or through a detector configured to detect the amount of energy in the radiation beam pulse and to arrange, or control, switching of the Pockels cell 20 to control the energy of the radiation beam pulse. Alternatively or additionally, the main part of the radiation beam pulse 28 may ultimately be used to apply a pattern to a substrate. The main part of the radiation beam pulse 28 may be tens, hundreds or thousands of times greater in intensity than the sample radiation beam pulse 30.

The sample radiation beam pulse 30 is directed towards a polarizing beam splitter 32, which splits the sample radiation beam pulse 30 into two orthogonal components, a first sample beam pulse component 34 and a second sample beam pulse component 36. The first sample beam pulse component 34 is directed towards a first detector 38. The first detector 38 is provided to determine the intensity of the first component 34 of the sample beam pulse 30. Similarly, the second component 36 of the sample beam pulse 30 is directed towards a second detector 40 configured to determine the intensity of the second component 36. The first detector 38 and second detector 40 output the detected intensities in the form of an electrical signal to a comparator 42 (or a differentiator, or similarly-functioning component) that is configured to compare the detected intensities (e.g., to determine a difference between the detected intensities). In turn, the comparator 42 is configured to provide an output signal 44 to a control device 46. In one embodiment, the control device 46 is arranged to control the position of the wedge 24, thereby controlling the amount of the wedge 24 through which the radiation beam pulse 22 passes.

In an embodiment, the apparatus of FIG. 6 determines the polarization state of the radiation beam pulse 22 after it has passed through the Pockels cell 20 and the wedge 24. Using a feedback unit that comprises the detectors 38 and 40, comparator 42 and control device 46, the apparatus may be configured to correct for any deviation in the polarization state of the radiation beam pulse 22 (for example, the deviation due to a change in temperature of the Pockels cell 20).

If the radiation beam pulse 22, which emerges from the Pockels cell 20 and wedge 24, is linearly polarized, one of the detectors 38 and 40 measures a maximum intensity, whereas the other detector will measure no intensity. In such a configuration, the comparator 42 subsequently determines that the difference in the detected intensities is equal to the maximum detected intensity, and this information will be passed to the control device 46. Therefore, the control device 46 will not need to change the position of the wedge 24 since the radiation beam pulse 22 is linearly polarized and orientated in a correct manner.

In another embodiment, if the temperature of the Pockels cell 20 changes, its length will also change. The change in length may result in a radiation beam pulse emerging from the Pockels cell 20 and wedge 24 which has a non-linear polarization state (e.g., an elliptical or circular polarization state). In such a case, after the polarizing beam splitter 32 has split the sample beam pulse 30 into two orthogonal components, the detectors 38 and 40 will no longer detect a maximum and zero intensity, respectively. Instead, the detectors 38 and 40 will detect non-zero intensities that are proportional to the degree of circular or elliptical polarization of the radiation beam pulse 22. The comparator 42 will be able to determine that the difference in the detected intensities is not a maximum and therefore, that the radiation beam pulse 22 is not linearly polarized. As such, an output signal 44 may be sent to the control device 46 instructing the control device 46 to move the wedge 24 to an appropriate location. The location will be calculated to ensure that the radiation beam pulse 22 will, after being transmitted through the Pockels cell 20, pass through a sufficient amount of the wedge 24 to have its polarization state corrected, i.e., returned to a desired polarization state, such as a linearly polarized state.

It will be appreciated that the determination and control of the polarization state of the radiation beam pulse can be undertaken periodically or continuously. The determination and control of the polarization state may be undertaken when the Pockels cell 20 has been switched from a first state to a second state, for example, when the Pockels cell has or has not been arranged to rotate the orientation of the polarization state of the radiation beam pulse by 90°.

Figure 7:
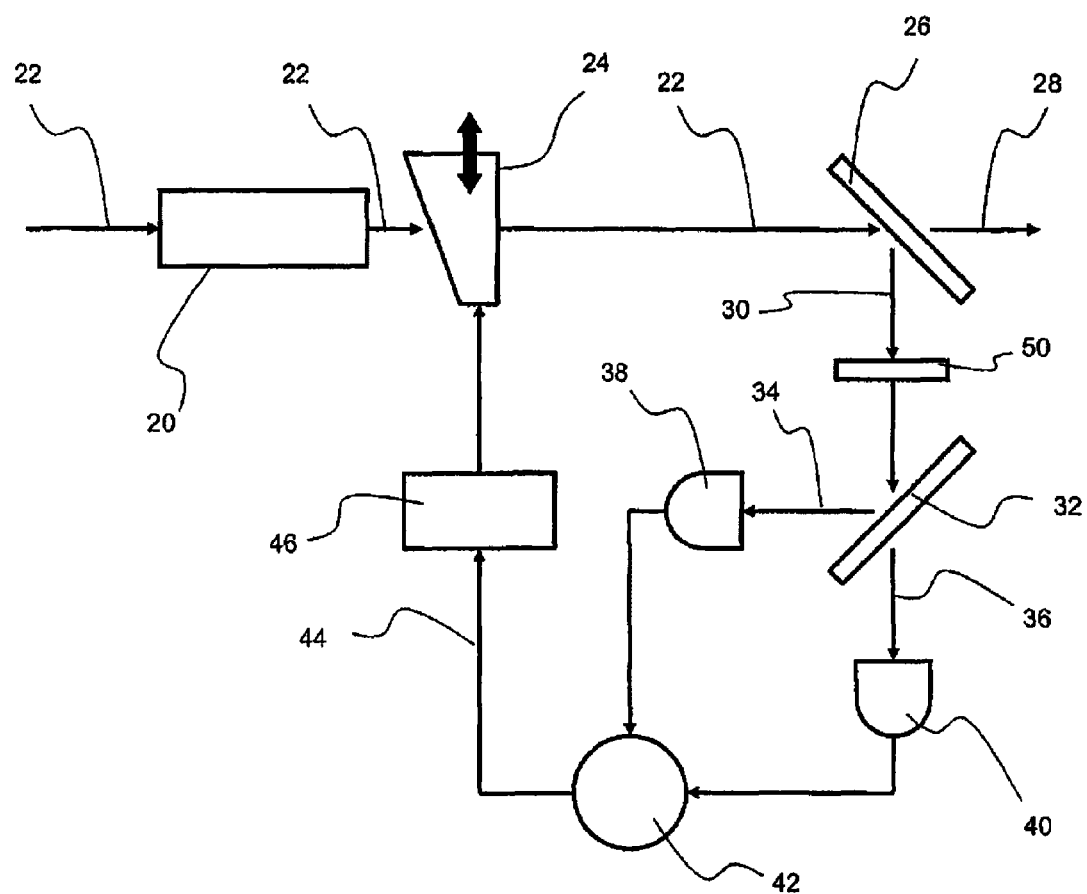

FIG. 7 depicts a polarization control apparatus in accordance with another embodiment of the present invention. In general, the apparatus of FIG. 4 is similar to the apparatus of FIG. 6. However, in FIG. 7, a quarter λ wave plate 50 is located in the path of the sample beam pulse 30 between the beam splitter 26 and the polarizing beam splitter 32. The inclusion of the quarter λ wave plate 50 makes the feedback and control function provided by the detectors 38 and 40, comparator 42, and control device 46 more reliable and more stable, as described below in relation to FIGS. 8a and 8b.

Figure 8A:
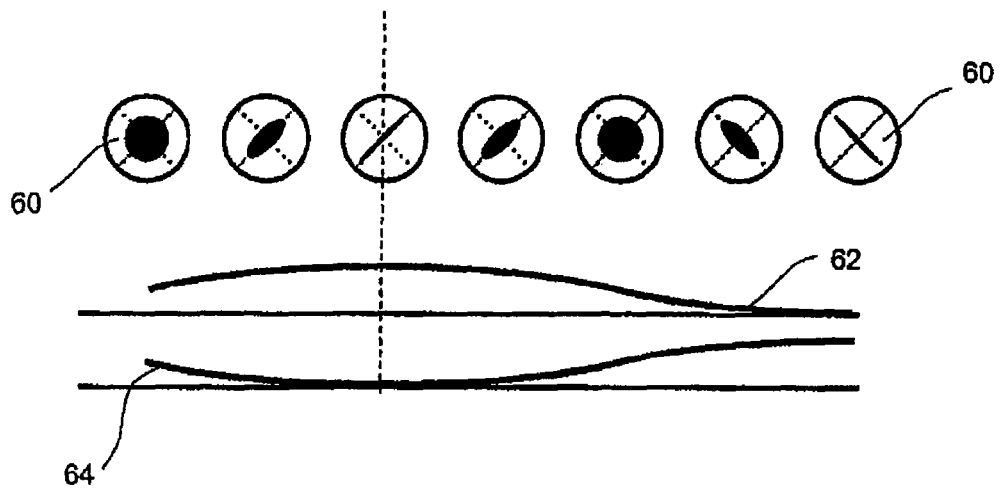
FIGS. 8a and 8b depict operating principles of the polarization state control apparatus depicted in FIGS. 6 and 7.

FIG. 8a schematically depicts various polarization states 60 of the sample beam pulse 30 shown in FIG. 6 (i.e., with no quarter λ wave plate used). FIG. 8a depicts a spectrum of polarization states 60, and the states 60 include, for example, linearly polarized states, elliptically polarized states, and circularly polarized states. The intensities detected by the first and second detectors 38 and 40 of FIG. 6 are shown beneath the polarization states 60 in FIG. 8a. A first graph 62 depicts the intensity detected by the first detector 38, and a second graph 64 depicts the intensity detected by the second detector 40. It can be seen that when the sample beam pulse 30 of FIG. 6 is linearly polarized in a first orientation, the intensity detected by the first detector 62 is at a maximum, whereas the intensity detected by the second detector 64 is at a minimum (i.e., zero intensity). The detected intensities 62 and 64 are substantially symmetrical in the vicinity of these maximum and minimum points, which corresponds to the sample beam pulse 30 being linearly polarized. Therefore, if the polarization state 60 deviates away from a linearly polarized state, it may be impossible to determine a direction in which the polarization state has deviated and/or how to correct for this deviation. This leads to an unstable control and feedback situation.

Figure 8B:
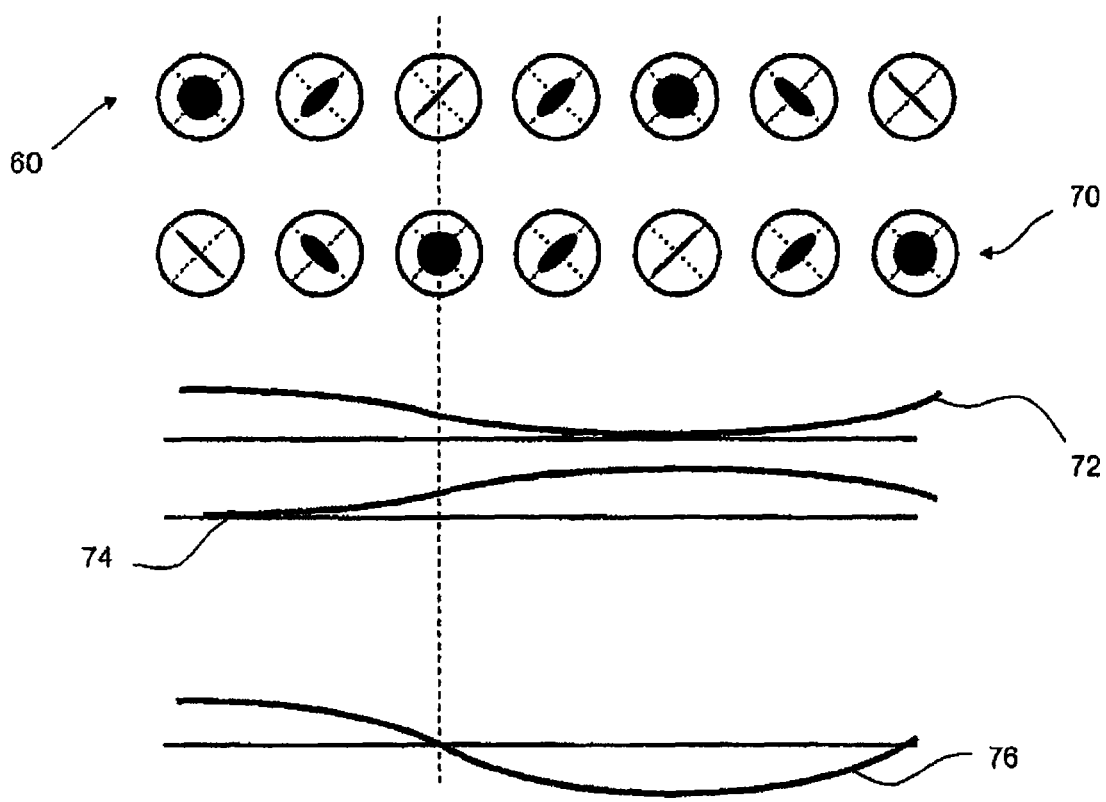

FIG. 8b depicts two rows of polarization states 60 and 70. A first row of polarization states 60 depict a range of possible polarization states for the sample beam pulse 30, as shown in FIG. 8a. A second row of polarization states 70 represent polarization states of the sample beam pulse 30 after it has passed through the quarter λ wave plate 50 of FIG. 7. Referring back to FIG. 8b, it can be seen that, for example, an incident linearly polarized radiation beam pulse has been converted by the quarter λ wave plate 50 into a circularly polarized beam pulse. Conversely, it can be seen that, for example, an incident circularly polarized radiation beam pulse has been converted by the quarter λ wave plate 50 into a linearly polarized beam pulse Three graphs 72, 74, and 76 are shown beneath the rows of polarization states 60 and 70. A first graph 72 represents the intensity detected by the first detector 38 of FIG. 7. The second graph 74 represents the intensity detected by the second detector 40. The third graph 76 represents a difference between the intensity detected by the respective detectors 38 and 40.

Referring to the first and second graphs 72 and 74, it can be seen that when the sample beam pulse 30 is linearly polarized (that is, before it passes through the quarter λ wave plate), the intensity detected by the detectors 38 and 40 is neither a maximum nor a minimum, but is somewhere in between (e.g., half the maximum intensity). This is because of the inclusion of the quarter λ wave plate, which has converted a linearly polarized beam pulse into an elliptically polarized beam pulse. It can be seen that the intensities represented by the graph 72 and 74 are not symmetrical about the point which coincides with a linearly polarized sample beam 30 (before it passes through the quarter λ wave plate). This means that the control and feedback function is no longer unstable, and therefore, it is now possible to determine which way (or in which direction) the polarization state of the beam pulse has deviated.

The third graph 76 illustrates that when the sample beam 30 is linearly polarized (before it passes through the quarter λ wave plate), the intensity detected by the detectors should be the same, such that the difference between the detected intensities is zero. In order to ensure that the radiation beam pulse maintains a linearly polarized state after passing through the Pockels cell and wedge, the control and feedback unit, which comprises the detectors, comparator and control device, may be arranged to ensure that the difference in detected intensities remains zero.

It is not essential that a quarter λ wave plate is used, or that the difference in detected intensities should be zero to achieve a linearly polarized radiation beam pulse after passing through the Pockels cell and wedge. In general, it is desirable to ensure that a linearly polarized radiation beam does not result in an unstable control or feedback unit. That is, it is desirable to ensure that the intensities detected by the detectors are not symmetrical about a point which corresponds to a linearly polarized radiation beam passing through the Pockels cell and wedge. If the detected intensities (or in other words intensity profiles) are non-symmetrical, it is possible to determine which way the polarization state has deviated and what corrections are needed to ensure that the radiation beam returns to a desired (e.g., linearly) polarized state.

One problem with the units shown in and described with reference FIGS. 6 and 7 arises when the polarization state of the radiation beam pulse changes from a linearly polarized state in a first orientation to a linearly polarized state in a second orientation that is orthogonal to the first orientation. When in the first orientation, the first detector will detect a maximum intensity whereas the second detector will detect a zero intensity. When the polarization state is rotated 90°, the first detector will detect a zero intensity, whereas the second detector will detect a maximum intensity. While this in itself is not problematic, a problem occurs at the comparator. At the comparator, when the polarization state rotates 90°, the difference in the intensity detected by the detectors will change from a positive maximum to a negative maximum. In other words, the output from the comparator may be a negative value when the polarization state rotates 90°, and may be a negative maximum value. A negative signal sent to the control device (which corrects for deviation of the polarization state) may destabilize the control device, and this is undesirable.

To overcome this problem, when a rotation of 90° of the linearly polarized state of the radiation beam pulse is detected (for example, when the Pockels cell is switched from one state to another), electronics may be configured to ensure that a negative control signal is not provided to the control device 46. In one embodiment, the electronics can negate or invert the negative signal. These electronics are fast enough to switch as fast, if not faster, than the Pockels cell 20, otherwise the signal provided to the control device may be negative, and this may destabilize the control device. Although the described solution is workable, an alternative solution which does not require fast switching electronics is depicted below in FIG. 9.

Figure 9:
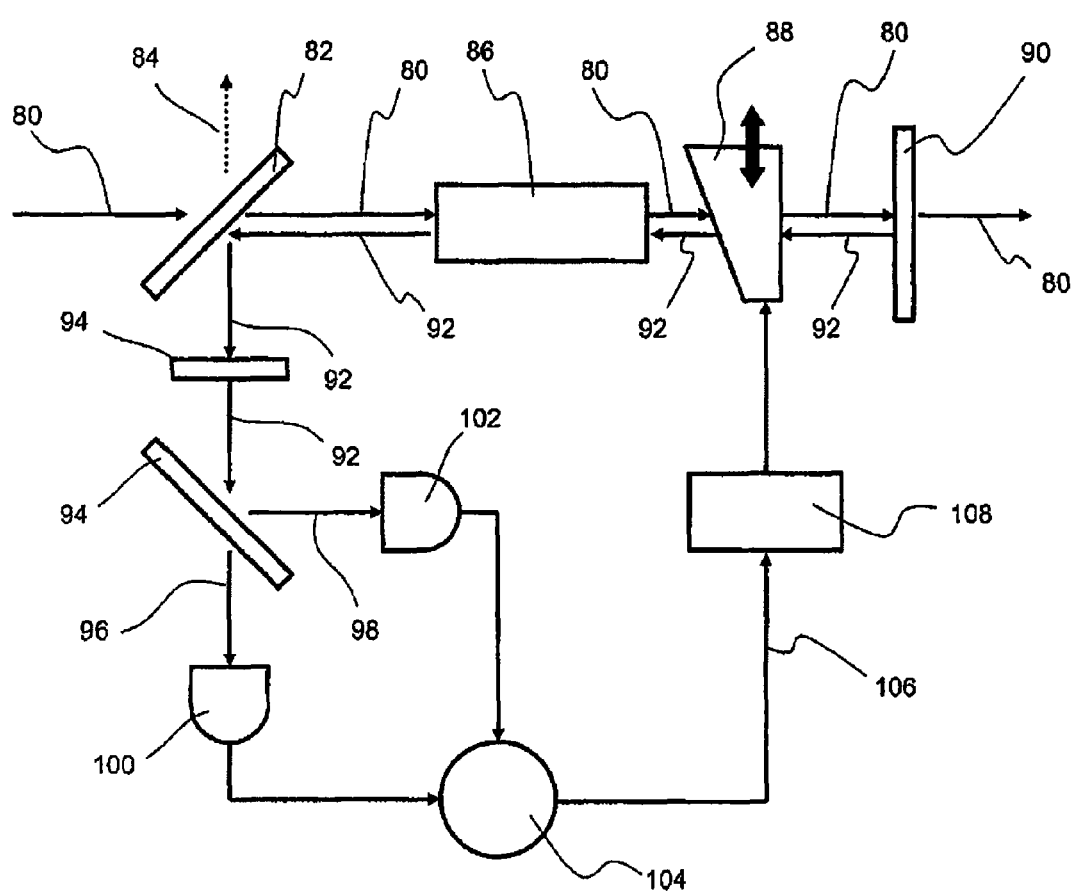
FIG. 9 depicts a polarization state control apparatus, according to an embodiment of the present invention.

FIG. 9 schematically depicts a polarization control apparatus, according to another embodiment of the present invention. In the embodiment of FIG. 9, a linearly polarized radiation beam pulse 80 is directed towards a beam splitter 82. While a small portion 84 of the radiation beam pulse may be reflected off the first beam splitter 82 and directed towards, for example, a beam dump (not shown), the majority of the radiation beam pulse 80 passes through the first beam splitter 82 and into a Pockels cell 86. After passing through the Pockels cell 86, the radiation beam pulse 80 passes through a wedge 88, which is formed from the same material as the Pockels cell 86 (for example, crystalline quartz).

When the radiation beam pulse 80 has emerged from the wedge 88 it is incident upon a partially reflecting mirror 90. The partially reflecting mirror 90 allows the majority of the radiation beam pulse 80 (e.g., 99% or more) to pass through the partially reflective mirror 90 and onto or through elements of the lithographic apparatus, including, but not limited to a detector or patterning device, as described in previous embodiments. A small portion 92 of the radiation beam pulse 80 is reflected away from the partially reflective mirror 90 and back toward and through the wedge 88 and Pockels cell 86. The reflected portion 92 then emerges from the Pockels cell 86 and is incident upon the beam splitter 82. The beam splitter 82 directs the reflected portion 92 of the radiation beam towards a quarter λ wave plate, the function of which is described above with respect to the apparatus of FIG. 7. After passing through the quarter λ wave plate 94, the reflected portion 92 is incident upon a polarizing beam splitter 94. The polarizing beam splitter 94 splits the reflected portion 92 into two orthogonal components 96 and 98, each of which are detected by individual detectors 100 and 102. The intensities detected by detectors 100 and 102 are then provided in the form of an electronic signal to a comparator 104, as described above. The comparator provides an output signal 106 to a control device 108, which is arranged to control the position of the wedge 88 in response to the output signal 106.

The function of the detectors 100 and 102, comparator 104, control device 108, and wedge 88 are described above, for example, in relation to the embodiments of FIGS. 5-7. These components provide a feedback which may be used to determine the polarization state of the radiation beam pulse 80 and control any deviation of the polarization state of the radiation beam pulse 80.

The advantage of reflecting the radiation beam 80 back through the wedge 88 and Pockels cell 86 is that the reflected portion 92 undergoes any changes caused by the Pockels cell 86 and wedge 88 twice. In the arrangements depicted in FIGS. 6 and 7, if the Pockels cell and wedge are arranged to ensure that the radiation beam remains linearly polarized, but changes orientation by 90°, the output signal provided by the comparator to the control device flips to a negative maximum value, which may de-stabilize the control device. However, in the apparatus shown in FIG. 9, any change in the polarization state introduced by the Pockels cell 86 and wedge 88 will be introduced twice into the reflected portion 92. Such changes will be introduced once on the first transmission through the Pockels cell 86 and wedge 88, and once upon the second transmission through the Pockels cell 86 and wedge 88 after the radiation beam has been reflected by the partially reflective mirror 90. As such, if the Pockels cell 86 and wedge 88 are arranged to rotate the orientation of the linearly polarized radiation beam pulse by 90° on each pass through the Pockels cell 86 and wedge 88, the reflected portion 92 will have its linearly polarized orientation rotated 180° before its intensity is detected. The intensity detected by the detectors 100, 102 will therefore not change when the orientation of the linearly polarized state changes by 90° twice (i.e., 180°). Consequently, this means that the comparator will not provide a negative signal to the control device 108 and the control device 108 will not be unstable.

It will be appreciated that the description of the radiation beam pulse 80 as being offset from the reflected radiation beam pulse portion 92 in FIG. 9 is for explanatory purposes only. In reality, the paths of the radiation beam pulse 80 and reflected radiation beam pulse portion 92 will, in general, coincide with one another.

In the embodiments described above, reference has been made to specific components controlling the polarization state of a radiation beam, detecting the polarization state of the radiation beam, and feeding back any deviation of the polarization state of the radiation beam back to the components which control the polarization state in order to account for any deviation of the polarization state. However, in additional embodiments, these specific control, detection, and feedback components may be replaced by any of a number of components that would be apparent to one skilled in the art without departing from sprit or scope of the present invention.

For example, in an additional embodiment, it is not essential to use a Pockels cell to control the polarization state of the radiation beam. Instead, a Kerr cell or a Faraday modulator could be used, or any other polarization state control unit suitable for modulating the polarization state of a radiation beam may be used without departing from the spirit or scope of the present invention.

Further, in additional embodiments, arrangements other than a moveable wedge may be used to correct the polarization state of the radiation beam. For example, an electrical unit could be used which is configured to control electrical properties of (e.g., the electric field applied across) the Pockels cell or other component, and these properties can be changed in response to a feedback signal. In one embodiment, an electric field applied across the Pockels cell may be increased or decreased in response to a detected deviation in the polarization state in order to change birefringence properties of the Pockels cell and account for or correct that deviation. In another embodiment, a temperature control unit may be provided to increase or decrease the temperature of the Pockels (or other component) in accordance with a feedback signal to change the length of the Pockels cell in order to correct or account for deviation in the polarization state of the radiation beam pulse. In a further embodiment, the Pockels cell or other component may be rotatable. By rotating the Pockels cell or other unit, the amount of material through which a radiation beam must pass through when transmitted can be controlled, thereby controlling the resultant polarization state of the radiation beam as it emerges from the Pockels cell or other component.

It is not essential to use a polarizing beam splitter and corresponding detectors to determine the polarization state of the radiation beam pulse, and any additional determination unit configured to determine the polarization state of the radiation beam may be used without departing from the sprit or scope of the present invention. In one embodiment, a sensor configured to detect a total dose of the radiation beam pulse may also be used to detect the polarization of the radiation beam, and therefore, it may not be necessary to split the radiation beam. In another embodiment, a temperature sensor may be used to determine the temperature of the Pockels cell or other component configured to control or modulate the polarization state of the beam pulse. From the determined temperature, a corresponding change in polarization state may be determined using a number of techniques, including, but not limited to a lookup table, experimentation, modeling, etc. In such an embodiment, there will be no need to optically detect the change in the polarization state in order to correct for or take into account any deviation.

Further, it is not essential to use a comparator to feedback a control signal to the polarization state control apparatus (or an intermediate controller of at least a component of the polarization state control apparatus). In additional embodiments, any feedback unit that is configured to provide a signal to the polarization control unit in order to correct for a determined deviation in the polarization state of the at least a part of the radiation beam from a desired polarization state may be used without departing from the spirit scope of the present invention.

In general, the invention provides an apparatus and method for controlling and determining the polarization state of a radiation beam (e.g., a radiation beam pulse, a plurality of pulses, or a continuous beam) and providing a feedback to the arrangement (e.g., in the form of an electrical signal, movement, or any other way of 0ing the polarization state control unit), which is dependent on the determined polarization state, in order to control the polarization state to take into account a deviation in the polarization state from a desired value (e.g. linearly polarized states of different orientations). The feedback and control of the polarization state control unit is such that the polarization state of the radiation beam is, or is returned to a desired polarization state. The deviation may be corrected for by, for example, moving a bi-refringent wedge in the path of the beam, by changing the temperature of the unit or other apparatus, or by changing the electrical properties of the unit or other apparatus, etc.

The polarization control apparatus shown in and described with reference to the FIGS. 5-9 may be located at any appropriate location in the lithographic apparatus. For example, the polarization control apparatus may be located in or adjacent to the radiation beam source, in or adjacent to the beam delivery system, in or adjacent to the illuminator, or at any other appropriate location.

Further, the polarization control apparatus described above is not limited to use in a lithographic apparatus, and in additional embodiments, the polarization control apparatus may be incorporated in a number of appropriate applications. For example, the polarization control apparatus may be used in a laser or other electromagnetic radiation source, or in conjunction with any optical apparatus, method, or procedure in which it would be desirable to monitor the polarization state of a beam or beam pulse and to control the polarization state of the beam or beam pulse (e.g., to account for deviation of the polarization state). The polarization control apparatus is, however, particularly applicable to lithographic apparatus utilizing a pulsed radiation beam. This is because in lithography, the energy of a radiation beam pulse may need to be accurately controlled, and the control of the polarization state of this radiation beam pulse (or more than one radiation beam pulses) may be useful in controlling this energy.

Figure 10:
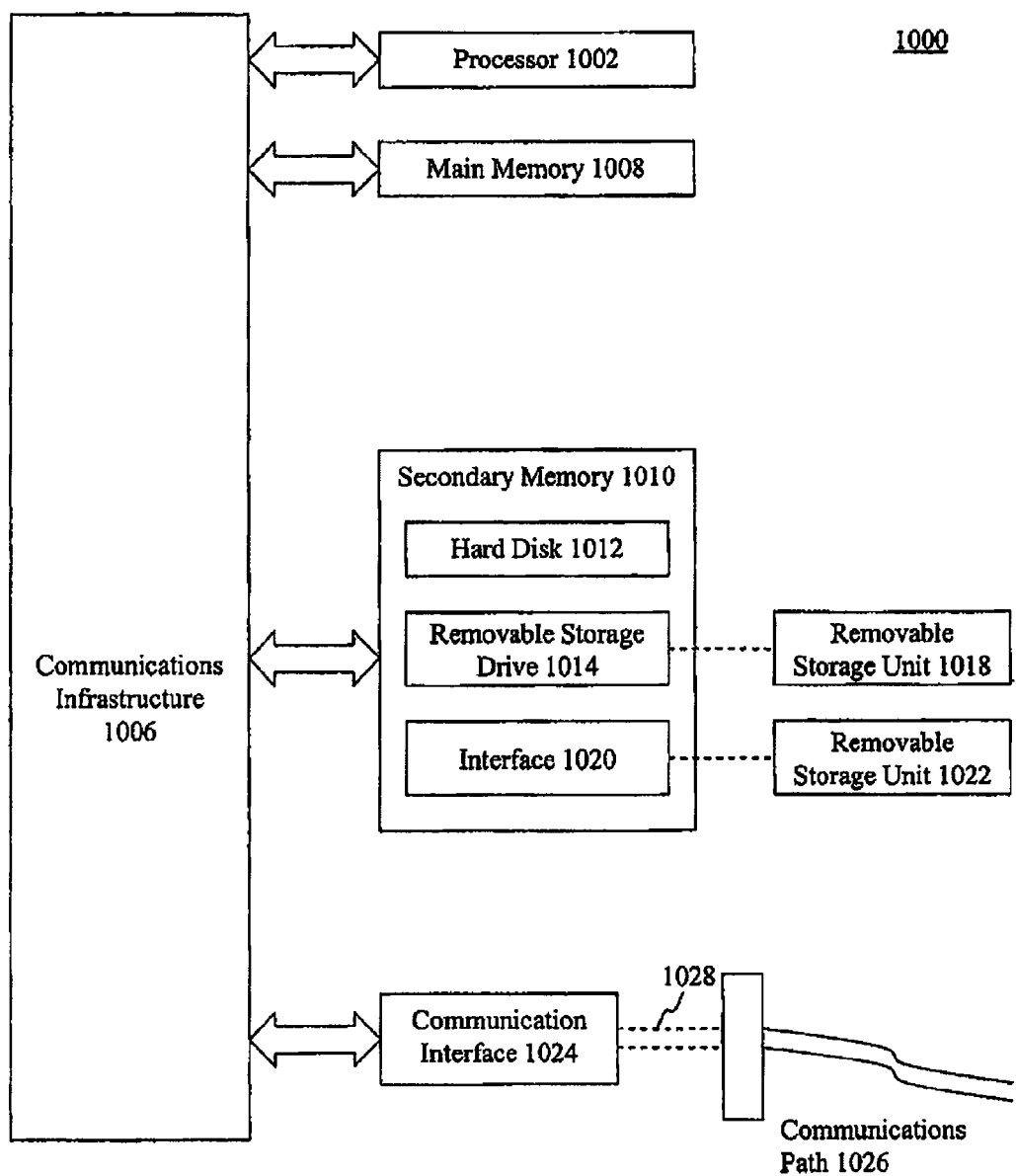
FIG. 10 depicts an exemplary computer system upon which the present invention may be implemented.

FIG. 10 depicts an exemplary computer system 1000 upon which the present invention may be implemented. The exemplary computer system 1000 includes one or more processors, such as processor 1002. The processor 1002 is connected to a communication infrastructure 1006, such as a bus or network. Various software implementations are described in terms of this exemplary computer system. After reading this description, it will become apparent to a person skilled in the relevant art how to implement the invention using other computer systems and/or computer architectures.

Computer system 1000 also includes a main memory 1008, preferably random access memory (RAM), and may include a secondary memory 1010. The secondary memory 1010 may include, for example, a hard disk drive 1012 and/or a removable storage drive 1014, representing a magnetic tape drive, an optical disk drive, etc. The removable storage drive 1014 reads from and/or writes to a removable storage unit 1018 in a well-known manner. Removable storage unit 1018 represents a magnetic tape, optical disk, or other storage medium that is read by and written to by removable storage drive 1014.

As will be appreciated, the removable storage unit 1018 can include a computer usable storage medium having stored therein computer software and/or data.

In alternative implementations, secondary memory 1010 may include other means for allowing computer programs or other instructions to be loaded into computer system 1000. Such means may include, for example, a removable storage unit 1022 and an interface 1020. An example of such means may include a removable memory chip (such as an EPROM, or PROM) and associated socket, or other removable storage units 1022 and interfaces 1020, which allow software and data to be transferred from the removable storage unit 1022 to computer system 1000.

Computer system 1000 may also include one or more communications interfaces, such as communications interface 1024. Communications interface 1024 allows software and data to be transferred between computer system 1000 and external devices. Examples of communications interface 1024 may include a modem, a network interface (such as an Ethernet card), a communications port, a PCMCIA slot and card, etc. Software and data transferred via communications interface 1024 are in the form of signals 1028, which may be electronic, electromagnetic, optical or other signals capable of being received by communications interface 1024. These signals 1028 are provided to communications interface 1024 via a communications path (i.e., channel) 1026. This channel 1026 carries signals 1028 and may be implemented using wire or cable, fiber optics, an RF link and other communications channels. In an embodiment of the invention, signals 1028 include data packets sent to processor 1002. Information representing processed packets can also be sent in the form of signals 1028 from processor 1002 through communications path 1026.

The terms "computer program medium" and "computer usable medium" are used to refer generally to media such as removable storage units 1018 and 1022, a hard disk installed in hard disk drive 1012, and signals 1028, which provide software to the computer system 1000.

Computer programs are stored in main memory 1008 and/or secondary memory 1010. Computer programs may also be received via communications interface 1024. Such computer programs, when executed, enable the computer system 1000 to implement the present invention as discussed herein. In particular, the computer programs, when executed, enable the processor 1002 to implement the present invention. Where the invention is implemented using software, the software may be stored in a computer program product and loaded into computer system 1000 using removable storage drive 1018, hard drive 1012 or communications interface 1024.

Although specific reference may be made in this text to the use of lithographic apparatus in the manufacture of a specific device (e.g. an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Having described specific embodiments of the present invention, it will be understood that many modifications thereof will readily appear or may be suggested to those skilled in the art, and it is intended therefore that this invention is limited only by the spirit and scope of the following claims.

What is claimed is:

1. An apparatus, comprising:
   a polarization control device configured to modulate a polarization state of at least a part of a radiation beam;
   a re-directing device configured to re-direct at least a portion of the part of the radiation beam through the polarization control device after the part of the radiation beam has passed through the polarization control device, thereby stabilizing a control device coupled to the polarization control device;
   a determination device configured to determine the polarization state of the part of the radiation beam; and
   a feedback device configured supply a signal to the polarization control device based on the determined polarization state,
   wherein the feedback device corrects for deviation in the polarization state of the part of the radiation beam from a desired polarization state.

2. The apparatus of claim 1, wherein a component of the polarization control device is moved in order to correct for the deviation.

3. The apparatus of claim 1, wherein a temperature of a component of the polarization control device is changed in order to correct for the deviation.

4. The apparatus of claim 1, wherein an electrical property of a component of the polarization control device is changed in order to correct for the deviation.

5. The apparatus of claim 4, wherein the electrical property is an electric field applied across the component of the polarization control device.

6. The apparatus of claim 1, wherein an orientation of a component of the polarization control device is changed in order to correct for the deviation.

7. The apparatus of claim 1, wherein the polarization control device comprises a component that exhibits controllable birefringence.

8. The apparatus of claim 1, wherein the polarization control device comprises a Pockels cell, a Kerr cell, or a Faraday modulator.

9. The apparatus of claim 1, wherein the polarization control device comprises a wedge of birefringent material.

10. The apparatus of claim 1, further comprising a beam splitter configured to split the part of the radiation beam into a first component and a second component.

11. The apparatus of claim 10, wherein the determination device is configured to determine the polarization state of at least the first component in order to determine the polarization state of the part of the radiation beam.

12. The apparatus of claim 1, further comprising a polarizing beam splitter configured to split the part of the radiation beam into two orthogonal components.

13. The apparatus of claim 12, further comprising at least one detector configured to detect an intensity of each of the orthogonal components.

14. The apparatus of claim 13, wherein the feedback device comprises at least one component for determining a difference between intensities of the two orthogonal components.

15. The apparatus of claim 14, wherein the feedback device comprises a control device configured to control a part of the polarization state control device in response to the difference in the intensities of the two orthogonal components.

16. The apparatus of claim 1, wherein the feedback device comprises a control device configured to control a part of the polarization state control device in response the deviation.

17. The apparatus of claim 1, comprising an electrical device configured to invert or negate the signal when the signal is a negative signal provided to the polarization state control device.

18. The apparatus of claim 1, further comprising an optical device configured to convert a linearly polarized radiation beam into a non-linearly polarized radiation beam.

19. The apparatus of claim 18, wherein the optical device is a quarter λ wave plate.

20. The apparatus of claim 1, wherein the determination device is configured to optically determine the polarization state of the at least a part of the radiation beam.

21. The apparatus of claim 1, wherein the determination device is configured to optically determine the deviation in the polarization state of the part of the radiation beam.

22. The apparatus of claim 1, wherein the determination device is configured to determine the polarization state of the part of the radiation beam using a temperature of one or more components of the polarization state control device.

23. The apparatus of claim 1, wherein the determination device is configured to determine the deviation in the polarization state of the part of the radiation beam using a change in temperature of one or more components of the polarization state control device.

24. The apparatus of claim 1, wherein the desired polarization state is a linearly polarized state.

25. The apparatus of claim 1, wherein the part of the radiation beam is a radiation beam pulse.

26. The apparatus of claim 1, further comprising:
an optical analyzer; and
an optical device configured to control an amount of the part of the radiation beam that passes through the optical analyzer.

27. A lithographic apparatus, comprising
a support device configured to support a patterning device configured to pattern a beam of radiation;
a projection system configured to project the patterned beam of radiation onto a substrate; and
a polarization state control apparatus, wherein the polarization state control apparatus comprises:
a polarization control device arranged to configure a polarization state of at least a part of the beam of radiation beam,
a re-directing device configured to re-direct at least a: portion of the part of the radiation beam through the polarization control device after the part of the radiation beam has passed through the polarization control device, thereby stabilizing a control device coupled to the polarization control device,
a determination device arranged to determine the polarization state of the part of the radiation beam, and
a feedback device configured supply a signal to the polarization control device based on the determined polarization state,
wherein the feedback device corrects for deviation in the polarization state of the at least a part of the radiation beam from a desired polarization state.

28. The lithographic apparatus of claim 27, wherein the radiation beam comprises a plurality of radiation beam pulses.

29. A method, comprising:
modulating, via a polarization control device, a polarization state of at least a part of a radiation beam;
re-directing at least a portion of the part of the radiation beam through the polarization control device after the part of the radiation beam has passed through the polarization control device, thereby stabilizing a control device coupled to the polarization control device;
determining the polarization state of the part of the radiation beam; and
controlling the modulation of the polarization state of the part of a radiation beam based on the determined polarization state to correct for deviation in the polarization state of the part of the radiation beam from a desired polarization state.

30. The method of claim 29, further comprising repeating the determining periodically.

31. The method of claim 29, further comprising repeating the determining continuously.

32. The method of claim 29, further comprising repeating the controlling periodically.

33. The method of claim 29, further comprising repeating the controlling continuously.

34. A system, comprising:
a processor,
a memory in communication with the processor, the memory for storing a plurality of processing instructions for directing the processor to:

modulate a polarization state of at least a part of a radiation beam;
determine the polarization state of the part of the radiation beam; and
control the modulation of the polarization state of the part of a radiation beam based on the determined polarization state to correct for deviation in the polarization state of the part of the radiation beam from a desired polarization state; and a re-directing device configured to re-direct at least a portion of the part of the radiation beam through a polarization control device after the part of the radiation beam has passed through the polarization control device, thereby stabilizing a control device coupled to the polarization control device.

* * * * *